United States Patent
Tseng et al.

(10) Patent No.: US 7,851,251 B2
(45) Date of Patent: Dec. 14, 2010

(54) PORTABLE OPTICAL DETECTION CHIP AND MANUFACTURING METHOD THEREOF

(75) Inventors: Fan Gang Tseng, Hsinchu (TW); Kuo Yung Hung, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 12/794,306

(22) Filed: Jun. 4, 2010

(65) Prior Publication Data

US 2010/0240168 A1      Sep. 23, 2010

Related U.S. Application Data (62) Division of application No. 12/106,679, filed on Apr. 21, 2008.

(30) Foreign Application Priority Data

May 2, 2007   (TW) .............................. 96115534 A (51) Int. Cl.
*H01L 21/00* (2006.01)
(52) U.S. Cl. .......................................... 438/91; 438/48
(58) Field of Classification Search ................... 438/91, 438/48
See application file for complete search history.

(56) References Cited

U.S. PATENT DOCUMENTS

| | | | | |
|---|---|---|---|---|
| 5,770,454 | A  * | 6/1998 | Essenpreis et al. | 436/164 |
| 6,197,503 | B1 * | 3/2001 | Vo-Dinh et al. | 435/6 |
| 6,623,696 | B1 * | 9/2003 | Kim et al. | 422/58 |
| 6,867,420 | B2 * | 3/2005 | Mathies et al. | 250/458.1 |
| 6,982,431 | B2 * | 1/2006 | Modlin et al. | 250/573 |
| 7,197,203 | B2 * | 3/2007 | Koyama | 385/14 |
| 7,201,836 | B2 * | 4/2007 | Vogel et al. | 205/777.5 |
| 7,480,042 | B1 * | 1/2009 | Phillips et al. | 356/243.1 |

* cited by examiner

*Primary Examiner*—Douglas M Menz
(74) *Attorney, Agent, or Firm*—WPAT, P.C.; Anthony King (57) ABSTRACT

A portable optical detection chip comprises a substrate, a plurality of avalanche-type photosensitive device modules and a plurality of plane mirrors. The plurality of avalanche-type photosensitive device modules are formed on the substrate, and each of them comprises a plurality of avalanche-type photosensitive devices and a plurality of lenses. Each of the lenses is stacked on one of the avalanche-type photosensitive devices. The plurality of plane mirrors are disposed between the avalanche-type photosensitive device modules. That is, the avalanche-type photosensitive device modules are separated from each other by the plane mirrors.

12 Claims, 8 Drawing Sheets

PORTABLE OPTICAL DETECTION CHIP AND MANUFACTURING METHOD THEREOF

CROSS-REFERENCES TO RELATED APPLICATIONS

This application is a Divisional of application Ser. No. 12/106,679, filed Apr. 21, 2008 which claims priority to and benefit of R.O.C. (Taiwan) Application No. 096115534 filed on May 2, 2007, which are hereby incorporated by reference in their entirety.

BACKGROUND OF THE INVENTION

1. Field of the Invention

The present invention relates to a portable optical detection chip and a manufacturing method thereof, and more particularly, to a biochip capable of parallel scanning in a dot-to-dot manner.

2. Description of the Related Art

The merits of biochips focus on utilizing fewer specimens and promptly and simultaneously detecting a plurality of diseases or specimens. The protein structure of a protein chip, a kind of biochip, has poor resistance to environmental conditions and easily becomes dormant; hence an optical detection method that is less harmful to protein specimens is commonly utilized for biomedical research. Such optical detection types include diffraction, absorption, fluorescence and many other types of measurements so the variable values of light intensity, frequency, polarization, phase shift and so on are measurable.

Figure 1:
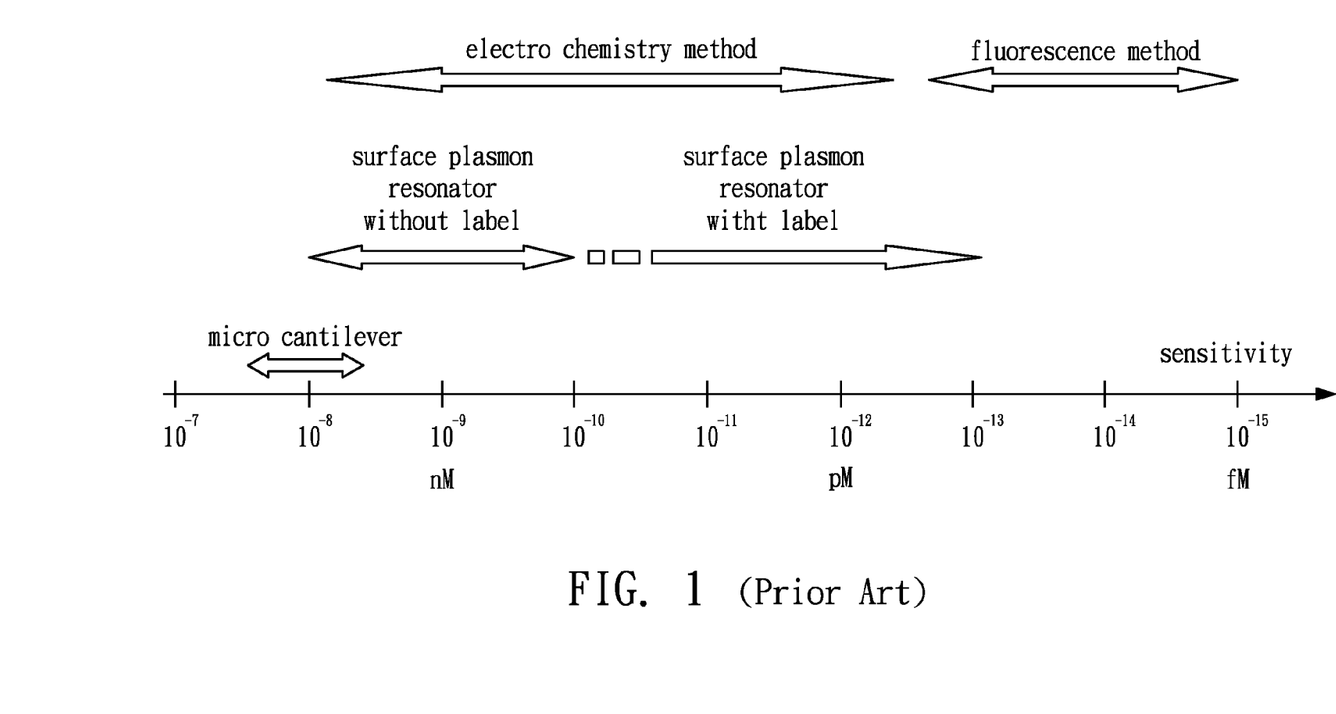
FIG. 1 shows current effective detection methods and distribution ranges of their response concentration.

FIG. 1 shows current effective detection methods and distribution ranges of their response concentration. The most advantageous of the photoelectrical technologies currently employed in the biomedical field is the fluorescence (or fluorescence spectrum) method due to its high sensitivity. In general, a fluorescence radiation rate is directly proportional to the concentration of the sample under detection. However, high concentration of the sample easily results in self-quenching and self-absorption problems in the fluorescence, and the fluorescence radiation rate is reduced. The sensing spectrum of the fluorescence method is similar to that of an absorption spectrum analysis method. But unlike an absorption spectrum analysis method, the fluorescence method needs a light source with high intensity such as a laser beam and white light because fluorescence-sensing molecules with high quantum yield are necessary and the signals to detect emitting light are easily affected by environmental factors such as temperature, pH values and ion intensity. After the fluorescence-sensing material reacts on the sample under detection, its structure, phase shift and half-life period are changed. The concentration of the detected sample is indicated by variations in these measured parameters.

Even though an electrochemistry method or a bioluminescence method can reduce interference from light sources so as to achieve the limitation pM of detected concentration, their applications are generally restricted by specificity. By contrast, the fluorescence method is less invasive to a substance with a detectable concentration below pM, and is a preferable method if it is performed with a miniaturized and highly-sensitive detector. A surface plasmon resonator can achieve nM concentration, create a label free system and perform quantative analyses, but such a resonator cannot easily fabricate portable and array chips like other methods. The fluorescence method can detect substances below pM and is non-invasive, highly sensitive, selective, able to provide multiple emissions (varying in intensity, phase, polarity, and life cycle), and is capable of minimization and arraying. A general fluorescence sensing system is primarily comprised of light sources, filters, spectroscopes, and optical detection elements with operation based on the principles of optics including spectrophotometry, optics of fluorescence and reflection, etc. This is a complicated system with a larger volume, and the optical detection elements and peripheral elements cannot be integrated with each other. Therefore, the objective of the present invention is to microminiaturize the fluorescence sensing system in order to achieve portability.

Tuan Vo-Dinh puts forth an integrated chip comprising bio-probes, samplers and detectors (including amplifiers and logic circuits). Consequentially, the feasible model of a DNA biochip detection system is obtained. Unlike other biosensor methods, Tuan Vo-Dinh's proposed method stamps or dots bio-molecules on a treated glass slide, and then the bio-molecules are detected by a system including an enormous amount of laser excitation sources and photosensors. The system comprises a great deal of elements, which negatively impacts the detection rate. The complexity of the system needs to be reduced so that the rate is prompted.

American Axon Co. puts forth a bio-scanner system with model No. GenePix 4000B. This commercial product has advantages of 5 μm resolution, double lasers, changeable focus and changeable laser power. It is a powerfully functional optical scanning system. However, the system requires a precise movable platform, an optical lens set and a detection module, so it is difficult to minimize the size of the system for portability and reduce the manufacturing cost to a level enabling disposability.

More common types of equipment currently applied in fluorescence detection include:

1. Confocal Laser Scanning Fluorescence Microscopy (CLSFM): Laser rays are condensed by a high-resolution microscope, and a sample of dots on a biochip is scanned. Photons emitted from the sample dots excited by the laser are collected by the microscope, and subsequently illuminate a highly light-sensitive phototube through a tiny pin hole. Because a point light source placed at a front focal point of the microscope is condensed at a back focus of that, except for an excitation light placed at the sample plane, nearly all scattered lights behind or ahead of the sample plane are filtered, if the front focus is aimed at the sample plane and a pin hole is located at the back focus. In this regard, it appears that the microscope has a very high vertical resolution at that time. Furthermore, if the magnification of the microscope is high, the laser rays are condensed into extremely tiny spots so that the horizontal resolution of the microscope is also excellent. Therefore, the greatest advantage of CLSFM is its very precise three-dimensional resolution capability, which can greatly enhance noise control capacity. A drawback of CLSFM is that it costs more because more time is required for chips with a large area and a greater number of sample points. A further drawback is that laser points focused by the lens have an extremely high intensity and when scanning sample points this inevitably causes damage to the sample.

2. Charged-Coupled Device (CCD): The technique involves shining rays evenly over an entire chip, taking an image of a chip by a CCD camera and inputting the brightness of each sample point as determined by a computer. Because the images of all sample points are simultaneously read and charge-coupled, speed and efficiency are significantly enhanced in comparison with the CLSFM. In addition, as illumination is not focused, it is unlikely for intensity to cause damage to samples. However, there are very strict requirements on optical elements, including the illumination source, imaging system, CCD selection, multipoint CCD, and front and back optical paths when using CCD. Furthermore, the system is very large and its cost is high.

In view of above, it appears that the conventional optical detection system can be improved by implementing the MEMS (Micro Electro Mechanical System) method and miniaturizing some elements. Accordingly, the conception of Lab on Chip is implemented.

SUMMARY OF THE INVENTION

One aspect of the present invention is to provide a portable optical detection chip and a manufacturing method thereof. An array-type avalanche photo diode is fabricated by using the manufacturing method of a semiconductor device, and the MEMS processes are further applied to it so as to obtain a three-dimensional optical micro-structure, such as micro-mirrors and micro-lenses. A portable micro chip for detecting optical signals is obtained by implementing the present invention, so the problems of large size and high expense of conventional biomedical detection platform systems are resolved.

Another aspect of the present invention provides a monolithic optical detection chip for resolving the problems occurring in the assembly and alignment of its elements.

The present invention provides a portable optical detection chip that comprises a substrate, a plurality of avalanche-type photosensitive device modules and a plurality of plane mirrors. The plurality of avalanche-type photosensitive device modules are formed on the substrate, and each of them comprises a plurality of avalanche-type photosensitive devices and a plurality of lenses. Each of the lenses is stacked on one of the avalanche-type photosensitive devices. The plurality of plane mirrors are disposed between the avalanche-type photosensitive device modules. That is, the avalanche-type photosensitive device modules are separated from each other by the plane mirrors.

The present invention provides a method for manufacturing a portable optical detection chip. A plurality of avalanche-type photosensitive devices are formed on a substrate. Except for photosensitive areas of the avalanche-type photosensitive devices, a hydrophobic layer is disposed on the substrate and on the avalanche-type photosensitive devices. Each lens is formed on one of the photosensitive areas of the avalanche-type photosensitive devices. A plurality of tilted plane mirrors are formed on the substrate, and partition the avalanche-type photosensitive devices into a plurality of groups.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 2:
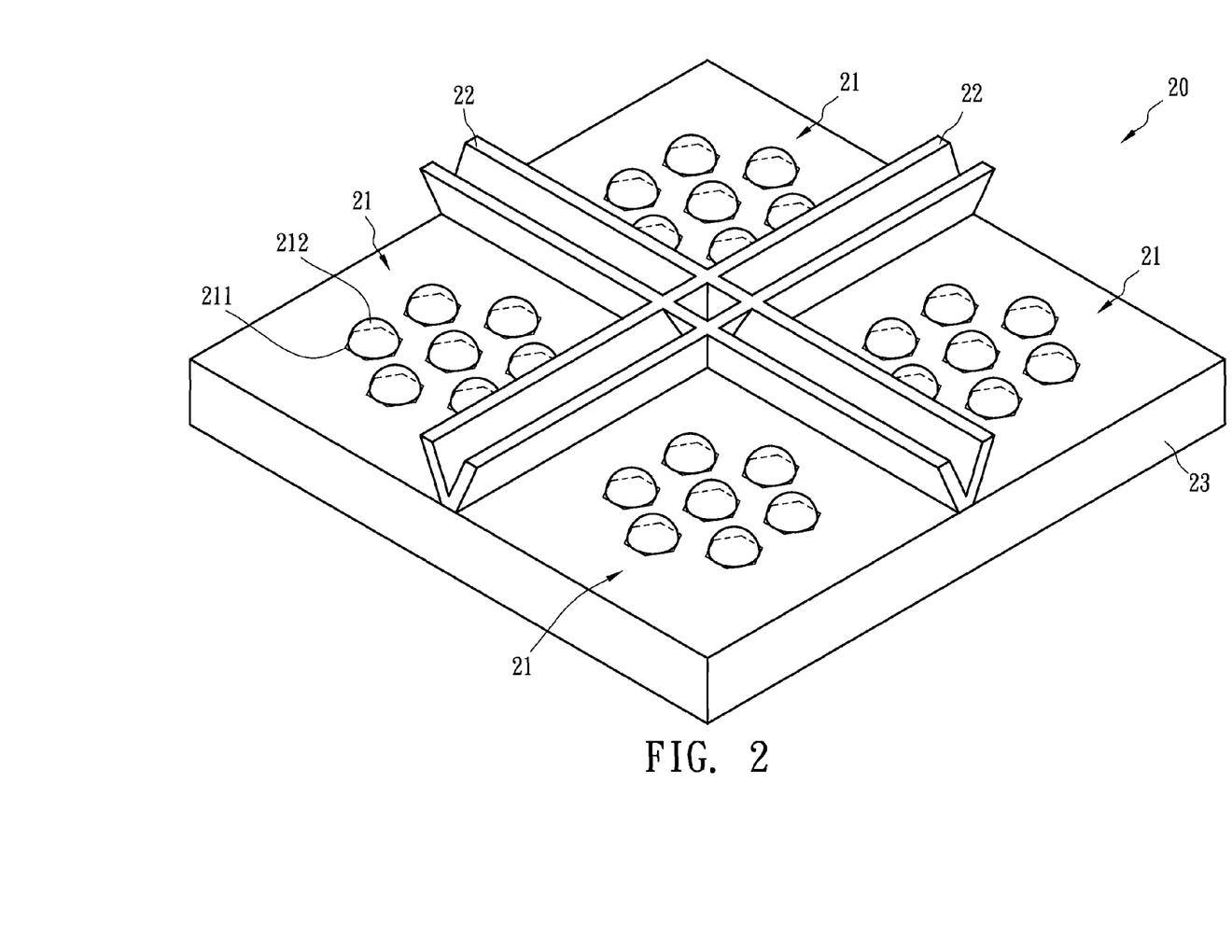
FIG. 2 is a perspective view of a portable optical detection chip in accordance with the present invention.

FIG. 2 is a perspective view of a portable optical detection chip in accordance with the present invention. A portable optical detection chip 20 comprises a substrate 23, a plurality of avalanche-type photosensitive device modules 21 and a plurality of plane mirrors 22. The avalanche-type photosensitive device modules 21 are formed on the substrate 23 using semiconductor device technology, and each comprises a plurality of avalanche-type photosensitive devices 211 and a plurality of lenses 212. Each of the lenses 212 is stacked on one of the avalanche-type photosensitive devices 211. The lens 212 are made of high transparent plastic materials. The plurality of plane mirrors 22 are disposed between the avalanche-type photosensitive device modules 21. That is, the avalanche-type photosensitive device modules 21 are separated from each other by the plane mirrors 22. The V-shaped plane mirrors 22 are formed on the substrate 23 by an oblique exposure method with light reflected on the substrate 23, and can isolate two adjacent fluorescent signals emitting from a detected biochip. That is, the V-shaped plane mirrors 22 can prevent the fluorescent signals respectively emitting from two adjacent samples from interfering with each other. Therefore, the portable optical detection chip 20 detects one corresponding sample dot (spot) on the detected biochip through each of the modules 21. It allows the use of point-to-point detection instead of the traditional serial-scanning approach in traditional scanner systems. Therefore, such new scanning approach for numerous biomedical assays saves time by using the detection chip.

Figure 3A:
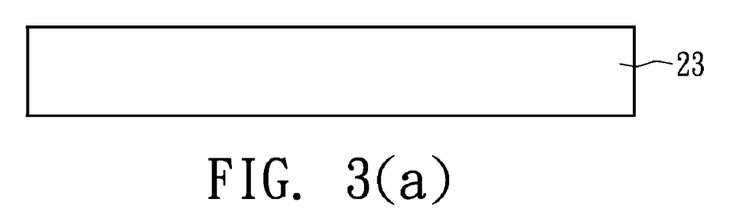
FIGS. 3(a)-3(i) are schematic views showing the manufacturing steps of an avalanche-type photosensitive device in accordance with the present invention.
Figure 3B:
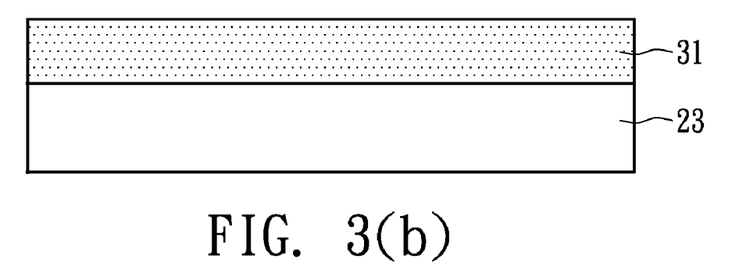
Figure 3C:
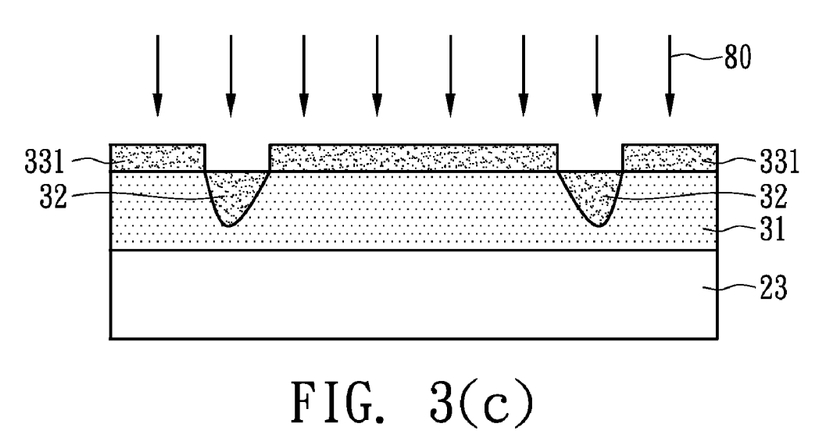
Figure 3D:
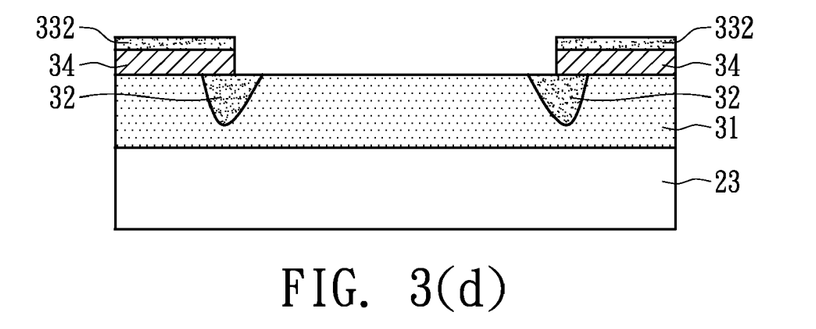
Figure 3E:
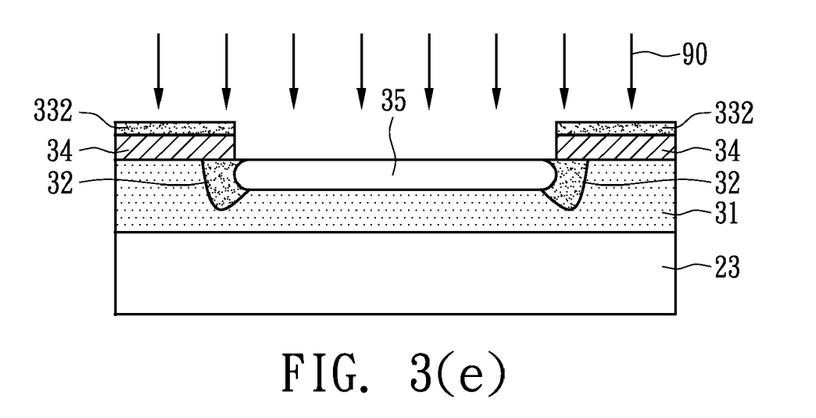

FIGS. 3(a)-3(i) are schematic views showing the manufacturing steps of an avalanche-type photosensitive device in accordance with the present invention. These drawings show the manufacturing steps of the avalanche-type photosensitive device 211 and the lenses 212. An N type epitaxial layer 31 is formed on a substrate 23, an N+ silicon wafer. Afterwards, boron ions 80 are implanted into the N type epitaxial layer 31 through the openings of a photoresist layer 331 to form a ring-shaped P type protection area 32 so as to prevent the occurrence of an early breakdown in the junction therein. The photoresist layer 331 is removed. An oxidation layer 34 (e.g. silica layer) and another photoresist 332 are sequentially formed on the peripheral of the N type epitaxial layer 31. P type dopants 90 are doped into the N type epitaxial layer 31 through the middle opening of the oxidation layer 34 (e.g. silica layer) and photoresist 332 to form a P+ type semiconductor area 35. As shown in FIG. 3(e), the P type protection area 32 surrounds the P+ type semiconductor area 35 so as to avoid the occurrence of edge avalanche breakdowns under a high reverse bias.

Figure 3F:
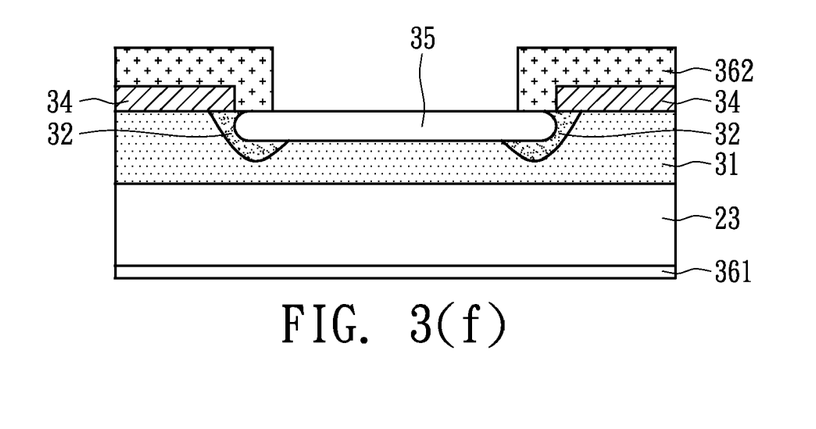
Figure 3G:
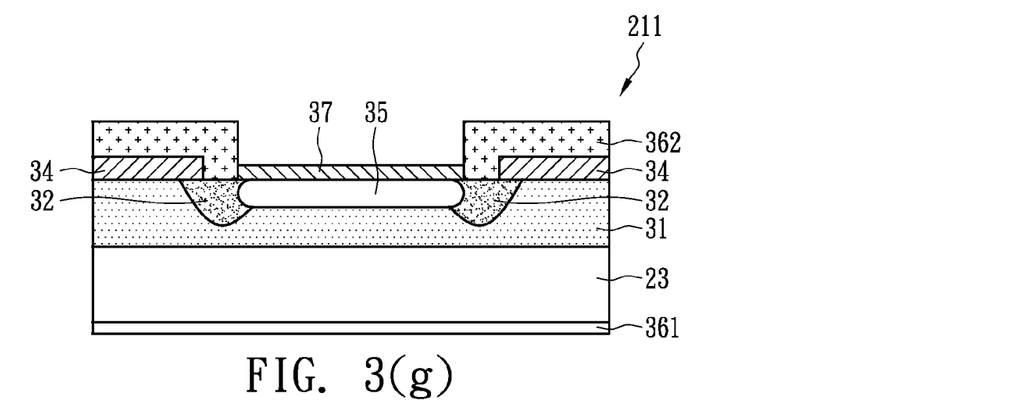
Figure 3H:
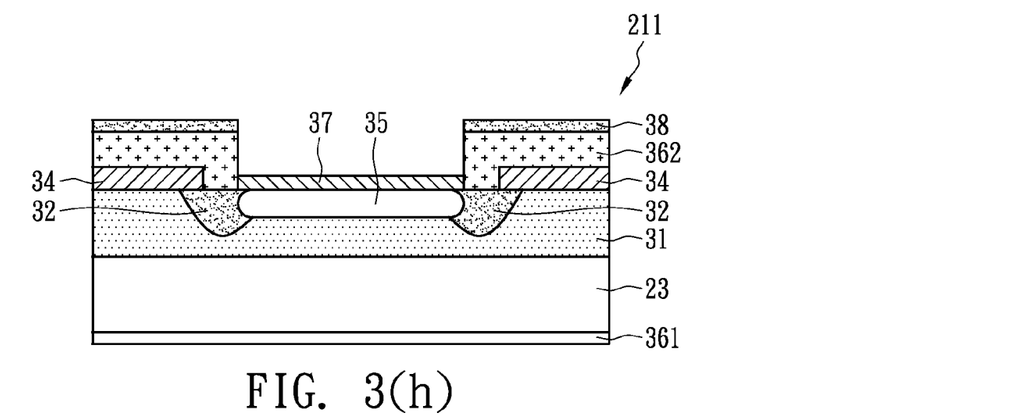
Figure 3I:
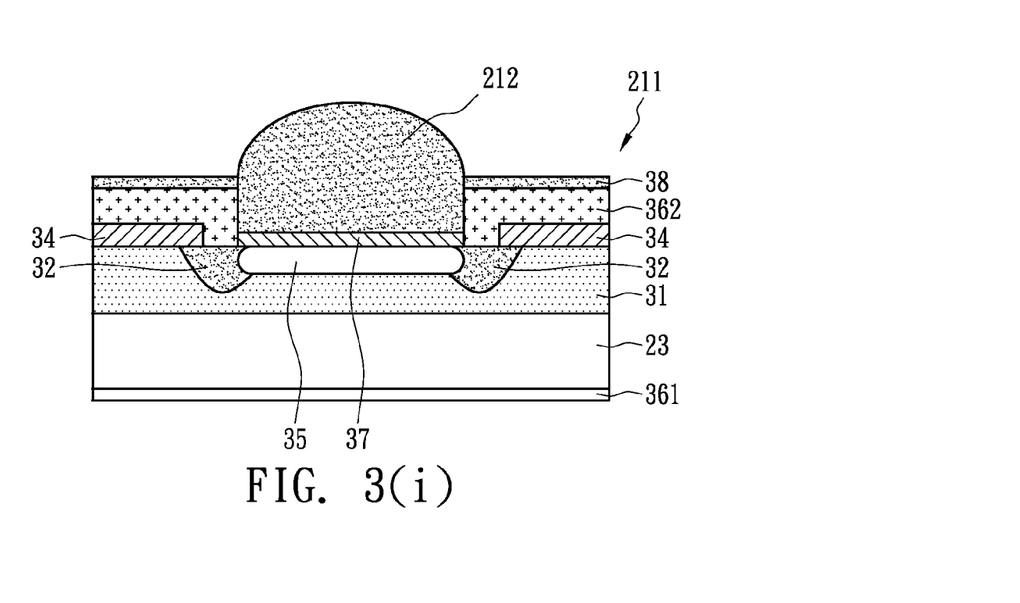

As shown in FIG. 3(f), a transparent P type electrode 362 is formed around the P+ type semiconductor area 35 and on the oxidation layer 34, and an N type electrode 361 is formed on the back of the substrate 23. The P type electrode 362 is an electrode made of a transparent material. The merit of the use of the transparent material is to increase photosensitive areas so as to improve photosensitive efficiency. Another oxidation layer 37 is further formed on the exposed portions of the P+type semiconductor area 35, and acts as an anti-reflection layer absorbing incident light. As shown in 3(h), the pattern of a hydrophobic layer 38, such as a Teflon layer, is defined by a lift off method, but the oxidation layer 37 cannot be covered with the hydrophobic layer 38. A UV curable photoresist material such as SU8 photoresist is finally coated on the substrate 23 by spinning, and remains only on the hydrophilic areas of the oxidation layer 37. Lenses 212 are obtained by soft baking the UV curable photoresist material. Most of the solvent in the UV curable photoresist material will evaporate if the temperature of the soft baking process is too high, and, accordingly, the UV curable photoresist material will have a dry and rough surface. Therefore, it is important to determine an optimal temperature and processing period of the soft baking process so that the UV curable photoresist material can be well cured to form the lenses 212 with preferable curved surfaces and unpredictable surface features can be avoided. The curved surface of the lens 212 is determined by surface tension. The lens 212 with a micro-spherical or non-spherical surface is formed by electrostatic forces. The P type electrode 362 can be utilized to control the profile of the non-spherical surface of the lens 212.

The present invention integrates the process of the avalanche-type photosensitive device 211 with the process of a high numerical aperture lens 212. The accumulation of weak optical signals can be improved and the loss of the optical signals resulting from the light absorption of the surface is reduced by using the integration processes so that the S/N ratio of the avalanche-type photosensitive device 211 is increased. Furthermore, the design of a reference signal can be further considered and added to the avalanche-type photosensitive device 211 of the portable optical detection chip 20 so as to avoid interference from environmental light and background noise signals. The use of the SU-8 photoresist is superior in the light transmitting rate for the condensing lens 212. The SU-8 photoresist is not easily reflowed. However, the present invention utilizes the differences of the surface free energy between the junction of the hydrophobic and hydrophilic areas to determine the positions and diameters of the lenses 212. Furthermore, the viscosity of the photoresist material can determine the height (or thickness) of the lens 212. The parameters of the numerical aperture lens can be varied by changing the diameters of a pattern design or selecting an optical medium (oil) with suitable viscosity rate and refractive index. The condensing efficiency of the micro lens is related to its numerical aperture. In general, the diameter of the numerical aperture is obtained by the following equation:

$$NA = n \times \sin(\mu),$$

where n is the refractive index of the lens material and $\mu$ is half the angle of the light collection angle aperture.

Figure 4:
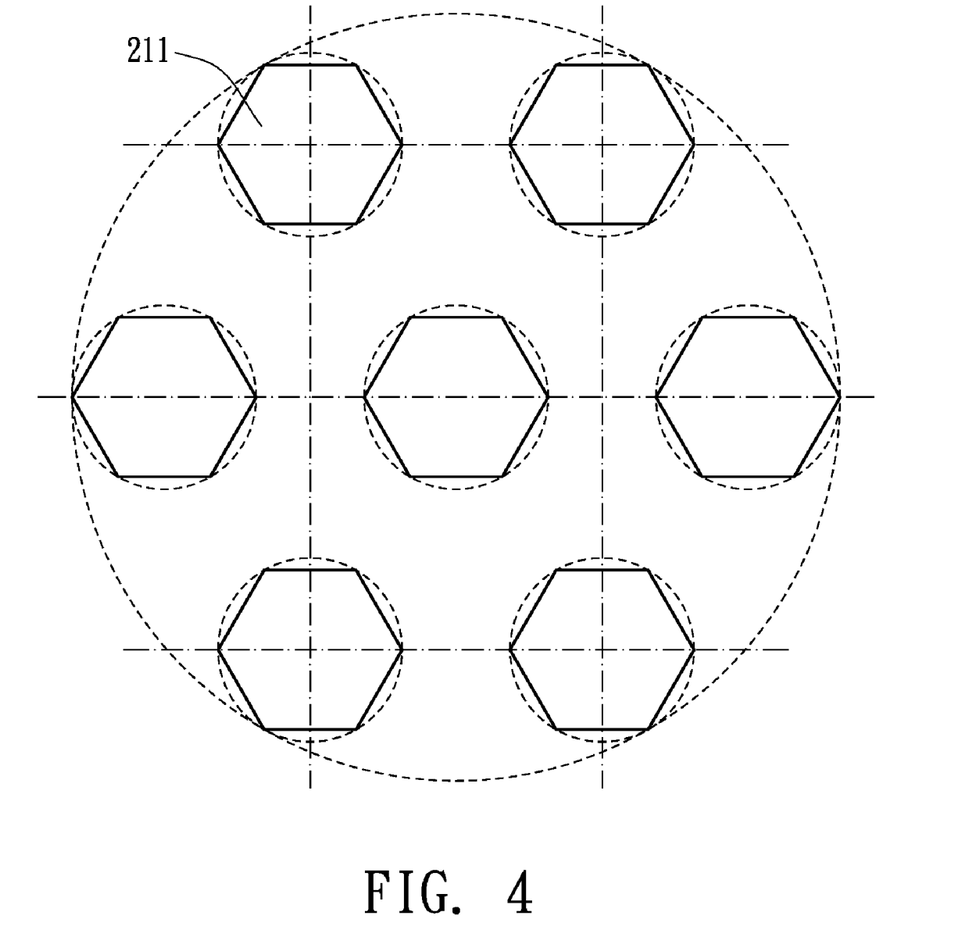
FIG. 4 shows a schematic view of an avalanche-type photosensitive device module comprising several avalanche-type photosensitive devices arranged into a hexagonal shape in accordance with the present invention.

FIG. 4 shows a schematic view of an avalanche-type photosensitive device module comprising several avalanche-type photosensitive devices arranged into a hexagonal shape in accordance with the present invention. Because the fluorescent point of the biochip to be detected is circular, and in order to increase testing reliability and provide an image testing mechanism, the present invention arranges several avalanche-type photosensitive devices 211 as a hexagon-like area to detect the circular fluorescent point. Such an arrangement is optimal because its area is very proximate to a circle. The maximum fill factor is 78.5% for rectangular, but is 90.6% for closed-packed, hexagonal arrays of circular lenses 212. The number of the avalanche-type photosensitive devices 211 varies based on where they are arranged as a ring. That is, except for the number of the first ring (the innermost ring), which is one, the number of the second ring or other rings can be represented by 6n, wherein n is the counting number of the ring.

Figure 5A:
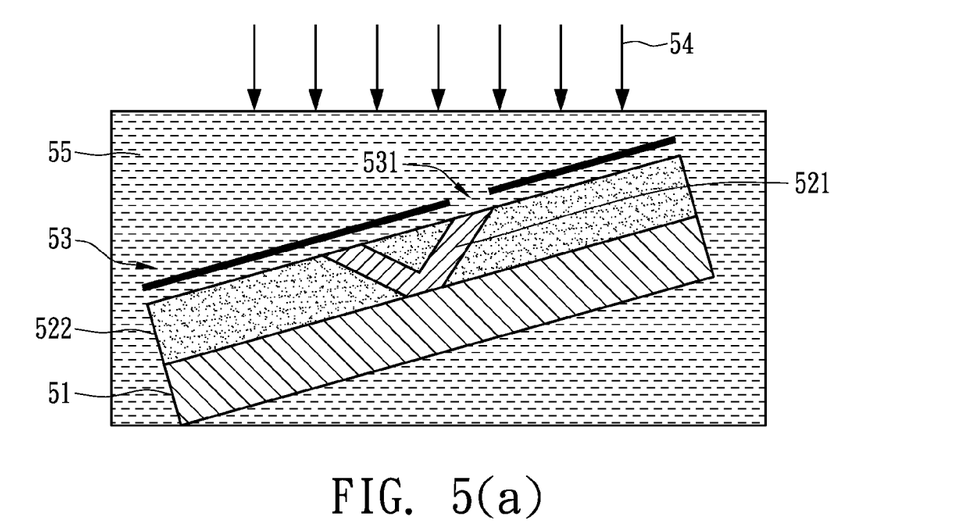
FIGS. 5(a)-5(b) show a schematic view of the manufacturing steps of a tilted plane mirror in accordance with the present invention.

The present invention further combines glycerol compensation technology with anti-reflection technology to form optical micro planar mirrors with an inclined angle ranging from 19 degrees to 90 degrees. Such combination of these processes can obtain inclined microstructures with various tilt angles suitable to different optical systems. FIG. 5(a) shows a schematic view showing a manufacturing step of a tilted plane mirror in accordance with the present invention. A mask 53 and a substrate 51 are immersed in glycerol 55, and an included angle is formed between the surface of one of them and the surface of the glycerol 55. Exposure light 54 is projected onto the surface of the glycerol 55 with a perpendicular incidence angle. Portions of the light 54 passing through the openings 531 of the mask 53 arrive at the surface of the substrate 51 with an included incidence angle. Most of light 54 arriving at the substrate 51 is reflected thereon with a reflection angle equal to the incidence angle, and is directed back towards the mask 53. Consequentially, a V-shaped exposure portion 521 is obtained in a UV curable photoresist material 522. The other unexposed portions will be removed during a succeeding development process. The exposure portion 521 remains on the substrate 51 so that the V-shaped plane mirror 22 is obtained.

Figure 5B:
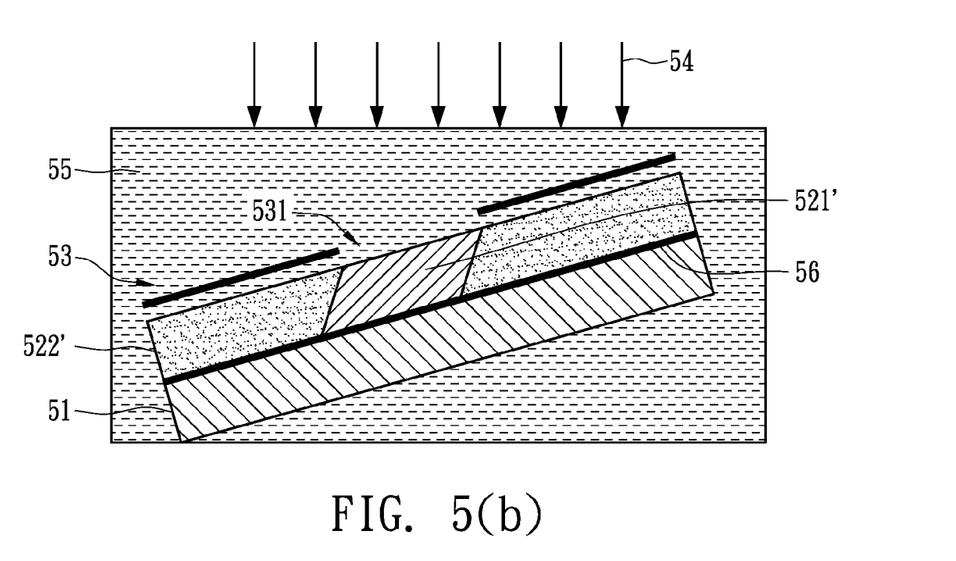

As shown in FIG. 5(b), instead of one exposure for the two symmetric inclined mirrors of the aforesaid V-shaped plane mirror 22, an anti-reflection layer 56 can be coated on the substrate 51. Portions of the light 54 passing through the openings 531 of the mask 53 arrive at the surface of the substrate 51 with an included incidence angle. The light 54 arriving at the substrate 51 is mostly absorbed by the anti-reflection layer 56. An exposed rhombus region 521' is formed in the UV curable photoresist material 522'. The other unexposed portions will be removed during a succeeding development process.

Figure 6:
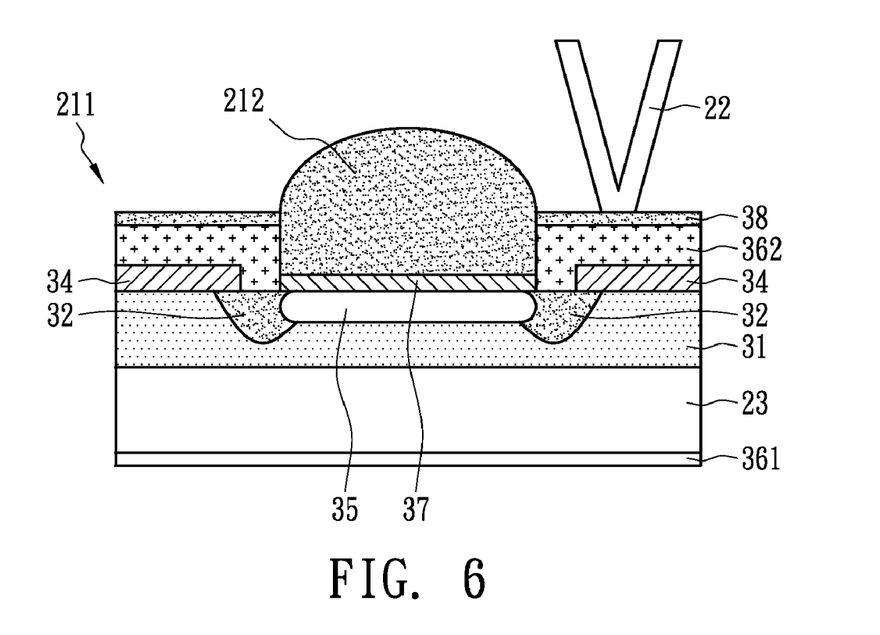
FIG. 6 shows a cross-sectional diagram showing a V-shaped planar mirror and adjacent avalanche-type photosensitive devices in accordance with the present invention.

FIG. 6 shows a cross-sectional diagram showing a V-shaped planar lens set and adjacent avalanche-type photosensitive devices in accordance with the present invention. After the lens 212 is formed, a plasma treatment is applied to the surface of the substrate 51. By using the method of the disclosure of FIG. 5(a), the V-shaped plane mirror 22 is formed on the hydrophobic layer 38.

The above-described embodiments of the present invention are intended to be illustrative only. Those skilled in the art may devise numerous alternative embodiments without departing from the scope of the following claims.

What is claimed is:

1. The method for manufacturing a portable optical detection chip, comprising the steps of:
    forming a plurality of avalanche-type photosensitive devices on a substrate;
    disposing a hydrophobic layer on the avalanche-type photosensitive devices and the substrate, wherein the hydrophobic layer covers areas excluding photosensitive areas of the avalanche-type photosensitive devices;
    forming a lens on the photosensitive area of each of the avalanche-type photosensitive devices; and
    forming a plurality of inclined plane mirrors on the substrate, wherein the plane mirrors partition the avalanche-type photosensitive devices into a plurality of groups.

2. The method for manufacturing a portable optical detection chip of claim 1, wherein the arrangement of the avalanche-type photosensitive devices in each of the avalanche-type photosensitive device modules approaches a circle.

3. The method for manufacturing a portable optical detection chip of claim 2, wherein the avalanche-type photosensitive devices of one of the avalanche-type photosensitive device modules are arranged into a hexagonal shape, with one of the avalanche-type photosensitive devices in the middle of the hexagon, and the other avalanche-type photosensitive devices are around the middle one.

4. The method for manufacturing a portable optical detection chip of claim 1, wherein the lens is curved surfaces formed on a UV curable photoresist material by surface tension.

5. The method for manufacturing a portable optical detection chip of claim 1, wherein the lens are made of high transparent plastic materials.

6. The method for manufacturing a portable optical detection chip of claim 1, wherein the lens has a micro-spherical or non-spherical surface formed by electrostatic forces.

7. The method for manufacturing a portable optical detection chip of claim 1, wherein the plane mirrors are pillars standing at an incline on the substrate and formed by an inclined exposure method.

8. The method for manufacturing a portable optical detection chip of claim 7, wherein the substrate, the UV curable photoresist material and a mask are immersed in glycerol after the inclined exposure method is performed.

9. The method for manufacturing a portable optical detection chip of claim 7, further comprising a step of forming an anti-reflection layer on the substrate.

10. The method for manufacturing a portable optical detection chip of claim 1, wherein the hydrophobic layer is a Teflon.

11. The method for manufacturing a portable optical detection chip of claim 1, wherein the avalanche-type photosensitive device has a ring-shaped protection area to avoid the early occurrence of breakdown in a junction in the avalanche-type photosensitive device.

12. The method for manufacturing a portable optical detection chip of claim 1, wherein the avalanche-type photosensitive device module detects corresponding sample spots on a biochip in a point-to-point manner.

* * * * *